United States Patent [19]
Easton et al.

[11] Patent Number: 5,870,431
[45] Date of Patent: Feb. 9, 1999

[54] ROM-BASED FINITE IMPULSE RESPONSE FILTER FOR USE IN MOBILE TELEPHONE

[75] Inventors: Kenneth D. Easton, San Diego; Peter J. Black, La Jolla, both of Calif.

[73] Assignee: Qualcomm Incorporated, San Diego, Calif.

[21] Appl. No.: 672,205

[22] Filed: Jun. 27, 1996

[51] Int. Cl.⁶ ............................. H04K 1/02; H04L 25/03
[52] U.S. Cl. ......................... 375/230; 375/229; 375/231
[58] Field of Search ..................... 375/231, 232, 375/296, 350, 229; 364/724.19, 724.16, 724.2; 333/18, 28 R

[56] References Cited

U.S. PATENT DOCUMENTS

| | | | |
|---|---|---|---|
| 4,551,816 | 11/1985 | Hyatt | 364/724 |
| 5,369,606 | 11/1994 | Hessel | 364/724.16 |
| 5,535,150 | 7/1996 | Chaing | 364/724.19 |
| 5,566,101 | 10/1996 | Kodra | 364/724.16 |
| 5,579,124 | 11/1996 | Aijala et al. | 386/96 |
| 5,586,068 | 12/1996 | Rakid | 364/724.16 |

*Primary Examiner*—Chi H. Pham
*Assistant Examiner*—Emmanuel Bayard
*Attorney, Agent, or Firm*—Russell B. Miller; Sean English; Brian S. Edmonston

[57] ABSTRACT

The finite impulse response (FIR) filter is implemented as a table using read-only memory (ROM). The FIR filter table stores a pre-calculated output filter value for each permissible combination of input values to be filtered. Streams of input values are successively shifted into the table and corresponding output values are successively output. In an exemplary implementation, the FIR filter is employed within a digital cellular telephone for use in smoothing a digital signal to be transmitted. The size of the required FIR filter table is minimized by exploiting constraints imposed upon the signal to be filtered and by exploiting linearity and symmetry within the filter itself. More specifically, the telephone employs a data burst randomizer to provide a data signal composed of sequences of null or 0 values and sequences of antipodal values (+1's and −1's). Hence, the permissible input combinations for the FIR filter include only patterns containing either all antipodal signals, all null signals, leading antipodal signals followed by trailing null signals, or leading null signals followed by trailing antipodal signals. The FIR filter look up is configured to exploit these limitations on the input streams yielding a look up table having relatively few entries. Method and apparatus implementations are disclosed.

39 Claims, 6 Drawing Sheets

FIG. 3A  9600 BPS FRAME

FIG. 3B  4800 BPS FRAME

FIG. 3C  2400 BPS FRAME

FIG. 3D  1200 BPS FRAME

ROM-BASED FINITE IMPULSE RESPONSE FILTER FOR USE IN MOBILE TELEPHONE

BACKGROUND OF THE INVENTION

I. Field of the Invention

The invention generally relates to mobile telephones and in particular to finite impulses response (FIR) filters for use within cellular telephones employing code division multiple access (CDMA) transmission techniques.

II. Description of the Related Art

Figure 1:
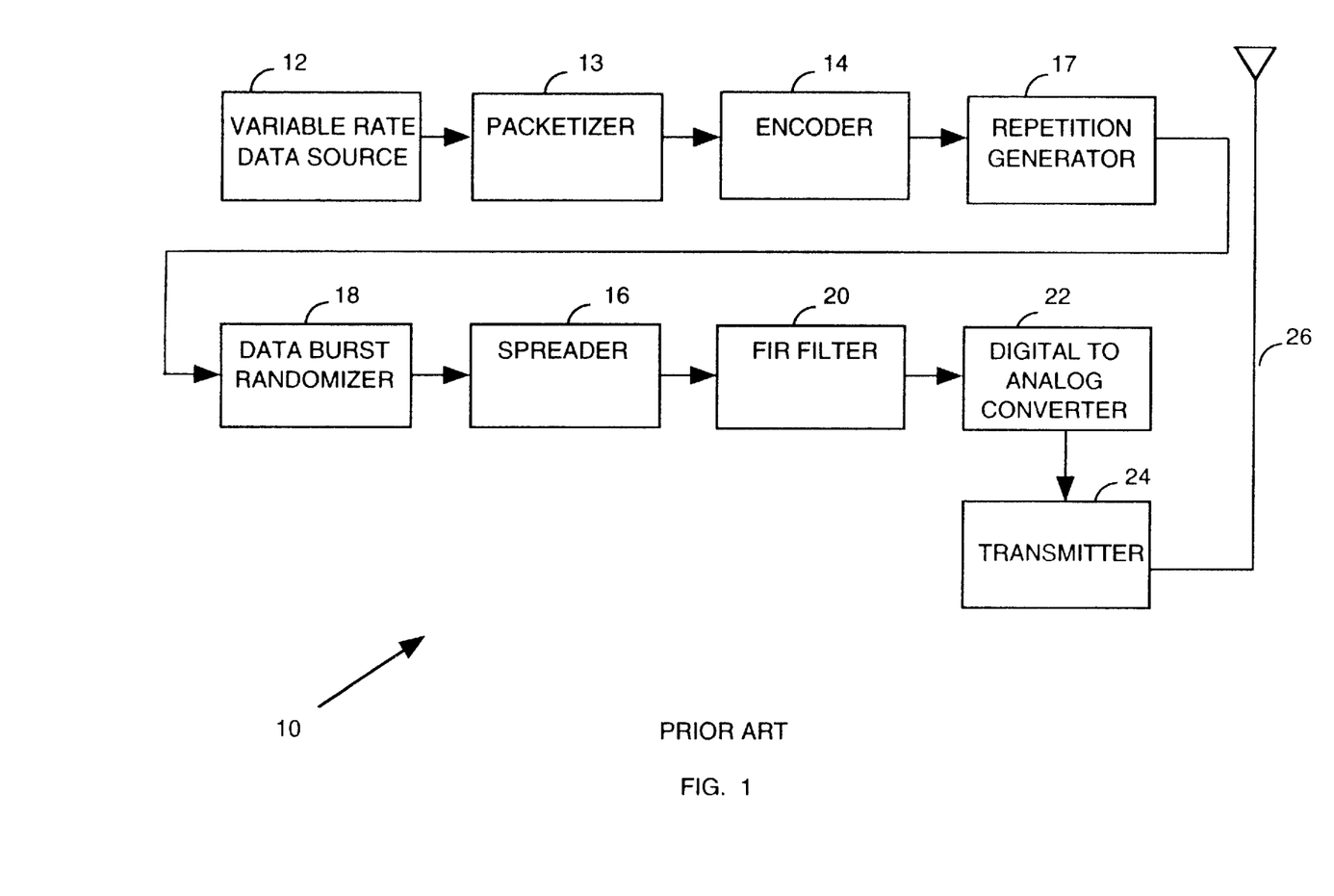
FIG. 1 is a block diagram of a transmit portion of a digital cellular telephone incorporating the FIR filter which is the subject of the present invention.

FIG. 1 is an illustrative block diagram of the variable rate code division multiple access (CDMA) transmission system as described in the Telecommunications Industry Association's Interim Standard *TIA/EIA/IS95-A Mobile Station-Base Station Compatibility Standard for Dual-Mode Wideband Spread Spectrum Cellular System*. Data for transmission by transmission system 10 is provided by a variable rate data source 12. In the exemplary embodiment, the variable rate data source is a variable rate vocoder used for the variable encoding of speech signals as described in detail in U.S. Pat. No. 5,414,796 which is assigned to the assignee of the present invention and is incorporated by reference herein.

In the exemplary embodiment, variable rate transmission system 10 transmits data in frames in accordance with TIA/EIA IS-95-A. Variable rate data source 12 receives digitized samples of input speech and encodes the speech to provide packets of encoded speech as illustrated in FIGS. 3A–3D. The output of variable rate data source 12 is the information bits shown in FIGS. 3A–3D. In the exemplary embodiment, variable rate data source 12 provides variable rate packets of data for transmission at four possible rates 9600 bps, 4800 bps, 2400 bps and 1200 bps, referred to herein as full, half, quarter, and eighth rates. Speech samples encoded at full rate contain 172 information bits, samples encoded at half rate contain 80 information bits, samples encoded at quarter rate contain 40 information bits and samples encoded at eighth rate contain 16 information bits.

Figure 3A:
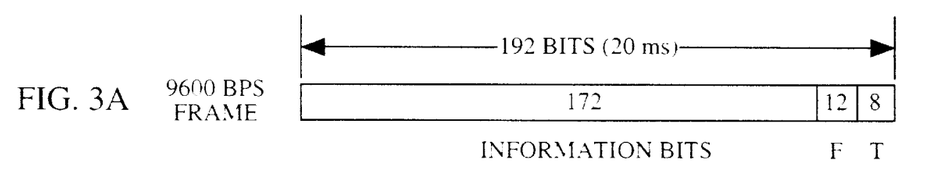
FIGS. 3A–3D are illustrations of the frame formats of the exemplary embodiment.
Figure 3B:
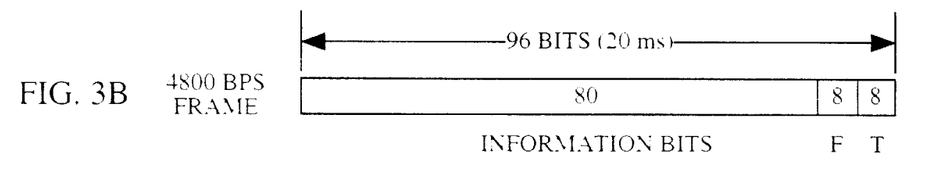
Figure 3C:
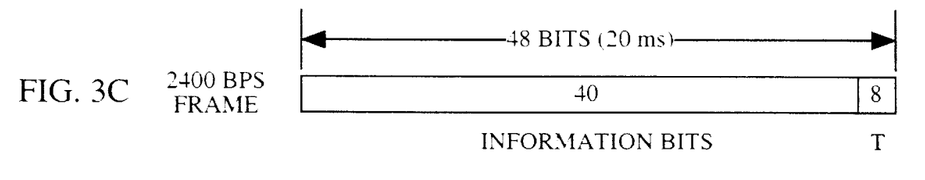
Figure 3D:
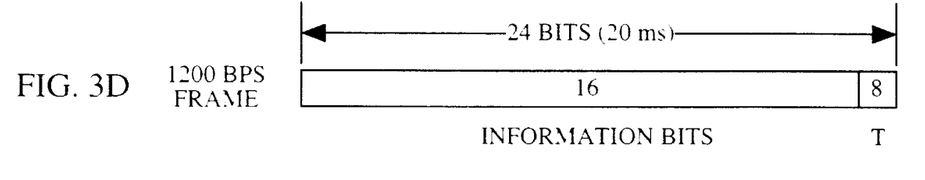

Referring again to FIG. 1, in the exemplary embodiment, the variable rate packets are provided to packetizer 13 which in the exemplary embodiment selectively appends cyclic redundancy check (CRC) bits and tail bits. As shown in FIG. 3A, when a frame is encoded by the variable rate data source 12 at full rate, packetizer 13 generates and appends 12 CRC bits and 8 tail bits. Similarly, as shown in FIG. 3B, when a frame is encoded by the variable rate data source 12 at half rate, packetizer 13 generates and appends 8 CRC bits and 8 tail bits. As shown in FIG. 3C, when a frame is encoded by the variable rate data source 12 at quarter rate, packetizer 13 generates and appends 8 tail bits. As shown in FIG. 3D, when a frame is encoded by the variable rate data source 12 at eighth rate, packetizer 13 generates and appends 8 tail bits.

The variable rate packets from packetizer 13 are then provided to encoder 14. Encoder 14 encodes the bits of the variable rate packets for error detection and correction purposes. In the exemplary embodiment, encoder 14 is a rate ⅓ convolutional encoder. The convolutionally encoded symbols are then provided to repetition generator 17.

In the exemplary embodiment, repetition generator 17 receives the packets. For packets of less than full rate, repetition generator 17 generates duplicates of the symbols in the packets to provide packets of a constant data rate. When the variable rate packet is half rate, then repetition generator 17 introduces a factor of two redundancy, i.e. each symbol is repeated twice within the output packet. When the variable rate packet is quarter rate, then repetition generator 17 introduces a factor of four redundancy. When the variable rate packet is eighth rate, then repetition generator 17 introduces a factor of eight redundancy.

In the exemplary embodiment, the encoded symbols are provided to CDMA spreader 16, an implementation of which is described in detail in U.S. Pat. Nos. 5,103,459 and 4,901,307 which are assigned to the assignee of the present invention and are incorporated by reference herein. In the exemplary embodiment, CDMA spreader 16 maps six encoded symbols to a 64 bit Walsh symbol and then spreads the Walsh symbols in accordance with a pseudorandom noise (PN) code.

In the exemplary embodiment, repetition generator 17 provides the redundancy by dividing the data packet into smaller sub-packets referred to as "power control groups". In the exemplary embodiment, each power control group consists of 6 Walsh symbols. The constant rate frame is generated by consecutively repeating each power control group the requisite number of times to fill the frame as described above.

The packets are then provided to a data burst randomizer 18 which removes the redundancy from the packets in accordance with a pseudorandom process as described in copending U.S. patent application Ser. No. 08/291,231, filed Aug. 16, 1994 assigned to the assignee of the present invention and incorporated by reference herein. Data burst randomizer 18 selects one of the power control groups for transmission in accordance with a pseudorandom selection process and gates the other redundant copies of that power control group.

Figure 4:
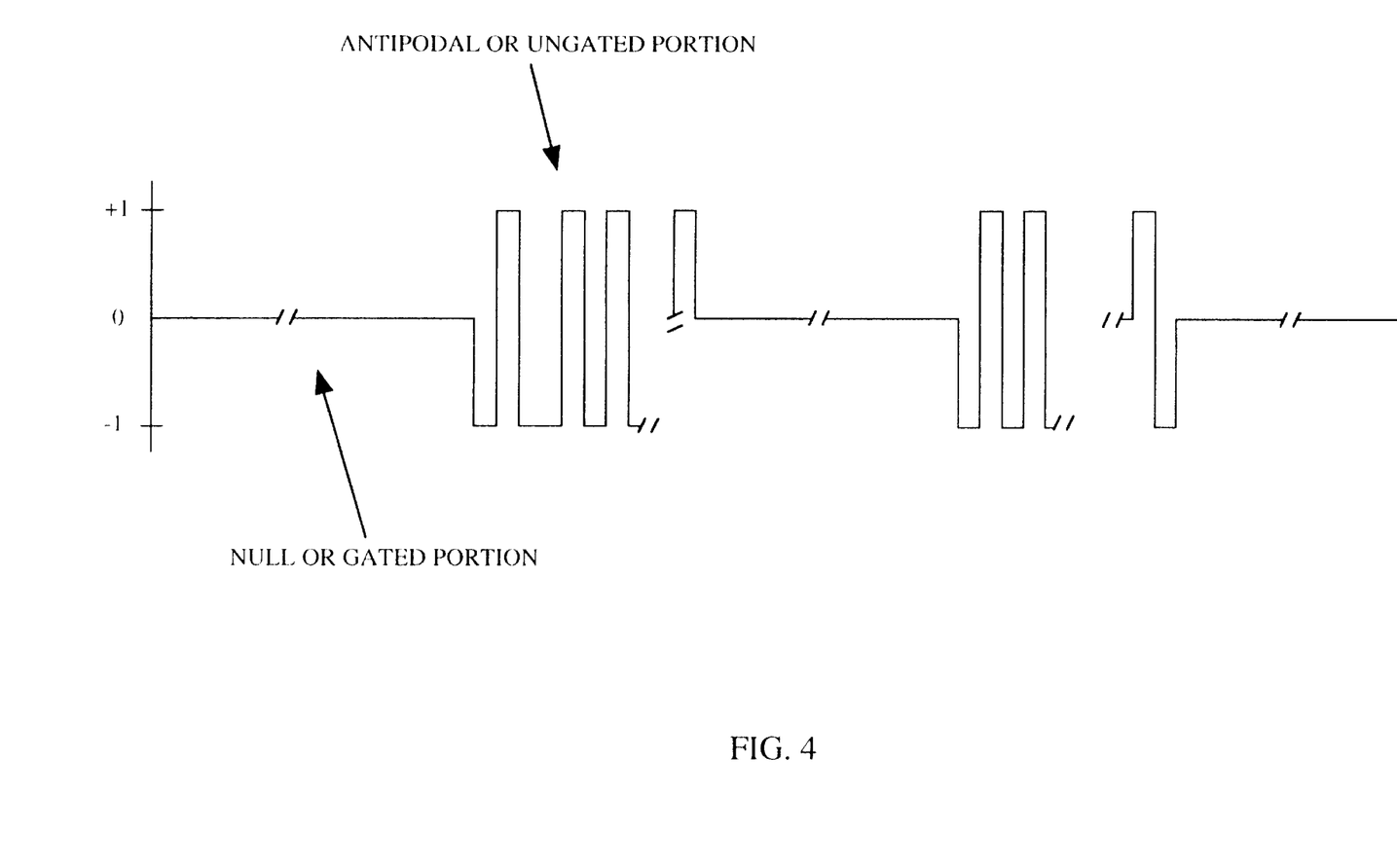
FIG. 4 is a is a timing diagram illustrating exemplary digital signals having both null portions and antipodal portions for filtering by the FIR filter of FIG. 1.

Thus, the output from data burst randomizer 18 consists of sequences of gated values with value 0 bracketing sequences of ungated antipodal data with values of +1 and −1. FIG. 4 illustrates a portion of an exemplary transmission signal having long null portions of value 0 bracketed by antipodal portions of +1's and −1's. Data burst randomizer 18 provides the packet to spreader 16.

The packets are provided by spreader 16 to finite impulse response (FIR) filter 20. The operation of an FIR filter can be described generally by equation 1 below:

$$y(n) = \sum_{k=0}^{N} h(k) \cdot x(n-k) \quad (1)$$

Figure 2:
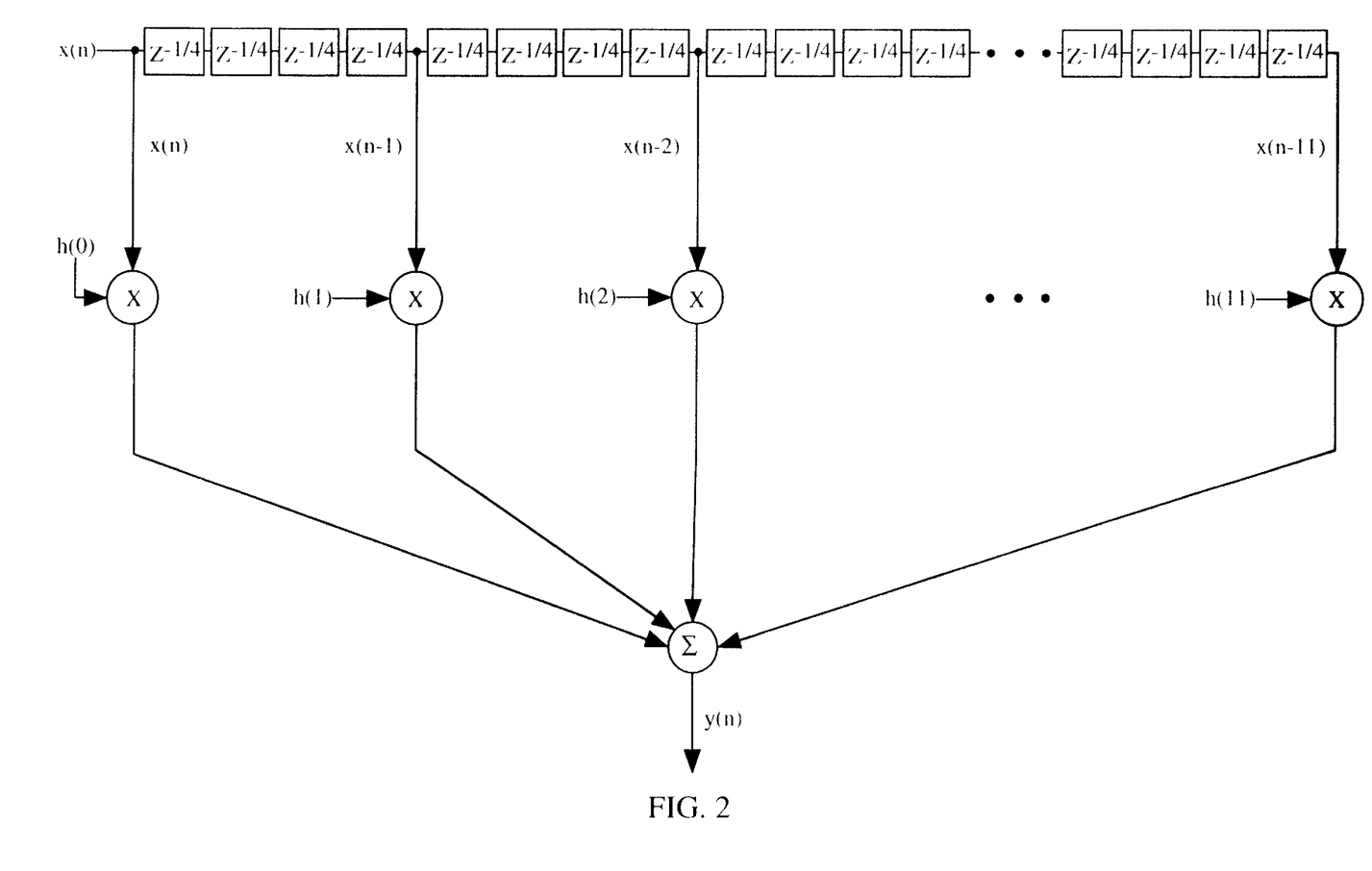
FIG. 2 is a block diagram of a 48-tap four times over sampled FIR filter.

In the exemplary embodiment, FIR filter 20 is a 4 times oversampled 48-tap FIR 20 filter illustrated in FIG. 2. As shown in FIG. 2, each sample is delayed by one fourth of the period of the input sequence. Thus, there is a four times redundancy in the data stream.

The filtered signal is then provided to digital to analog-converter 22 and converted to an analog signal. The analog signal is then provided to transmitter 24 which upconverts and amplifies the signal for transmission through antenna 26.

Conventionally, FIR filter 20 would be implemented by means of a digital signal processor or specially designed hardware programmed to perform the numerical calculations of equation 1. For portable cellular telephones, however, the power required to operate the processor or specialized hardware may be unacceptably high. So there is a need for a more efficient means of implementing the FIR filter.

SUMMARY OF THE INVENTION

The method for more efficiently implementing FIR filter 20 employs a ROM (read only memory) based look up in which the values of the data in the delay elements are used to select a pre-calculated output value. It should be noted that although the operation is described in terms of using a read only memory, that other combinatorial logic elements can be used to generate the outputs as described in the exemplary embodiment using read only memory elements. To implement the 4 times oversampled 48-tap FIR filter as a look up table, one way is to map all possible combinations of 0, +1 and −1 chips in the forty-eight tap positions. This would require a ROM table with $3^{48}$ values. By taking advantage of the fact that with four times oversampling (four samples are output for each chip input) only 12 of the values are contributing to the determination of an output value, the table can be reduced to a table with $3^{12}$ different entries which, although representing a distinct improvement, is still impractical for many applications.

A first method by which the size of the look up table can be reduced is by implementing the look up table in two parts. Finding the output that results from the twelve values of x(n) to x(n−11) can be achieved by first finding the contribution from x(n) to x(n−5) and then finding the contribution from x(n−6) to x(n−11). FIR filtering is a linear operation. Hence, the output of the filter can be found simply by summing the two contributions.

In the exemplary embodiment, the FIR filter is symmetric. Hence, the filter coefficients for determining contributions for x(n) to x(n−5) may also be used to determine contributions for x(n−6) to x(n−11). This further reduces the necessary number of elements in the look-up table to $3^6$.

The next method for reducing the size of the look up table is by taking advantage of the fact that there are only a limited number of ways that 0's can occur in the data stream as a result of the operation of the data burst randomizer. As noted above, the data burst randomizer operates to create a signal having sequences of antipodal bits (+1's and −1's) bracketed by sequences of all 0's. Thus, if there is a 0 in the data stream input to the filter, then either all the bits in the filter will be zero or a stream of zeros will be entering or leaving. No other combinations of antipodal values and zeros is permissible. All possibilities of permissible input bit patterns is shown below in TABLE I.

TABLE I

| ±1 | ±1 | ±1 | ±1 | ±1 | ±1 | (64 outputs) |
| 0 | ±1 | ±1 | ±1 | ±1 | ±1 | (32 outputs) |
| 0 | 0 | ±1 | ±1 | ±1 | ±1 | (16 outputs) |
| 0 | 0 | 0 | ±1 | ±1 | ±1 | (8 outputs) |
| 0 | 0 | 0 | 0 | ±1 | ±1 | (4 outputs) |
| 0 | 0 | 0 | 0 | 0 | ±1 | (2 outputs) |
| 0 | 0 | 0 | 0 | 0 | 0 | (1 outputs) |
| ±1 | 0 | 0 | 0 | 0 | 0 | (2 outputs) |
| ±1 | ±1 | 0 | 0 | 0 | 0 | (4 outputs) |
| ±1 | ±1 | ±1 | 0 | 0 | 0 | (8 outputs) |
| ±1 | ±1 | ±1 | ±1 | 0 | 0 | (16 outputs) |
| ±1 | ±1 | ±1 | ±1 | ±1 | 0 | (32 outputs) |

A first row of the table represents sixty-four possible combinations of un-gated power control groups, i.e. power control groups consisting only of antipodal +1's and −1's. The seventh row of the table represents the single entry required for a fully gated power control group masked to provide all 0's. The remaining rows of the table represent the chip patterns associated with streams of chips having gated power control groups being shifted in or shifted out.

The total number of entries required to implement TABLE I, as determined by summing the number of outputs specified in the table, is only 189. This is significantly less than the $3^{12}$ entries that would be required if the look up table did not exploit either FIR filter linearity or the constraints provided by the data burst randomizer.

In accordance with one aspect of the invention, a FIR filter apparatus is provided for use in filtering an input signal stream comprised of sequences of antipodal signals bracketed by sequences of null signals. The filter apparatus comprises means for storing a look up table containing a FIR filter output value for each of a predetermined set of unique permissible input bit stream patterns and means for successively applying portions of the input digital signal stream to the means for storing the table to output a sequence of output values corresponding to a filtered version of the input stream. As a result of the configuration of the input signal stream, the predetermined set of permissible input patterns includes only patterns containing either all antipodal signals, all null signals, leading antipodal signals followed by trailing null signals, or leading null signals followed by trailing antipodal signals.

In one specific implementation, the apparatus is employed within a digital cellular telephone configured to encode and transmit signals in accordance with CDMA protocols. The means for storing the filter response table is a ROM. The input to the filter forms the address to the ROM. The output of the ROM therefore provides the partial FIR filter response to that input. In the exemplary embodiment, separate in-phase and quadrature phase FIR values are stored.

In the exemplary embodiment, the FIR filter is four times over sampled. When a data value enters the FIR filter, it is applied to the first tap. The input value then proceeds to be applied four times to the tap values with different phase coefficients. Each application of that data value to the first tap of the filter can be referred to as a filter phase. In the exemplary embodiment, the ROM filter table is sub-divided into four separate sub-tables corresponding to each of four possible filter phases. The output values of the FIR filter table are predetermined to emulate a forty-eight tap four times oversampled FIR filter. In this regard, the output values are pre-calculated from a set of forty-eight coefficient values with each set of twelve coefficient values employed for generating the output values of the corresponding four phases of the table.

In one possible implementation, each of the four sub-tables of each of the in-phase and quadrature phase tables stores 189 entries for a total of 756 entries per table. However, for the exemplary implementation described herein, the total number of entries per table is only 378. This further reduction in table size is achieved by taking advantage of the linearity of the filter. In alternate implementation, the table size can be reduced to only 128 entries. A wide range of other embodiments may be provided consistent with the principles of the invention.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

With reference to the remaining figures, exemplary embodiments of the invention will now be described. The exemplary embodiments will primarily be described with reference to block diagrams illustrating apparatus elements. Depending upon the implementation, each apparatus element, or portions thereof, may be configured in hardware, software, firmware or combinations thereof. It should be appreciated that not all components necessary for a complete implementation of a practical system are illustrated or described in detail. Rather, only those components necessary for a thorough understanding of the invention are illustrated and described.

The FIR filter table of the invention will be generally described with reference to FIG. 5. Then, a specific exemplary implementation of the invention will be described with reference to FIG. 6.

Figure 5:
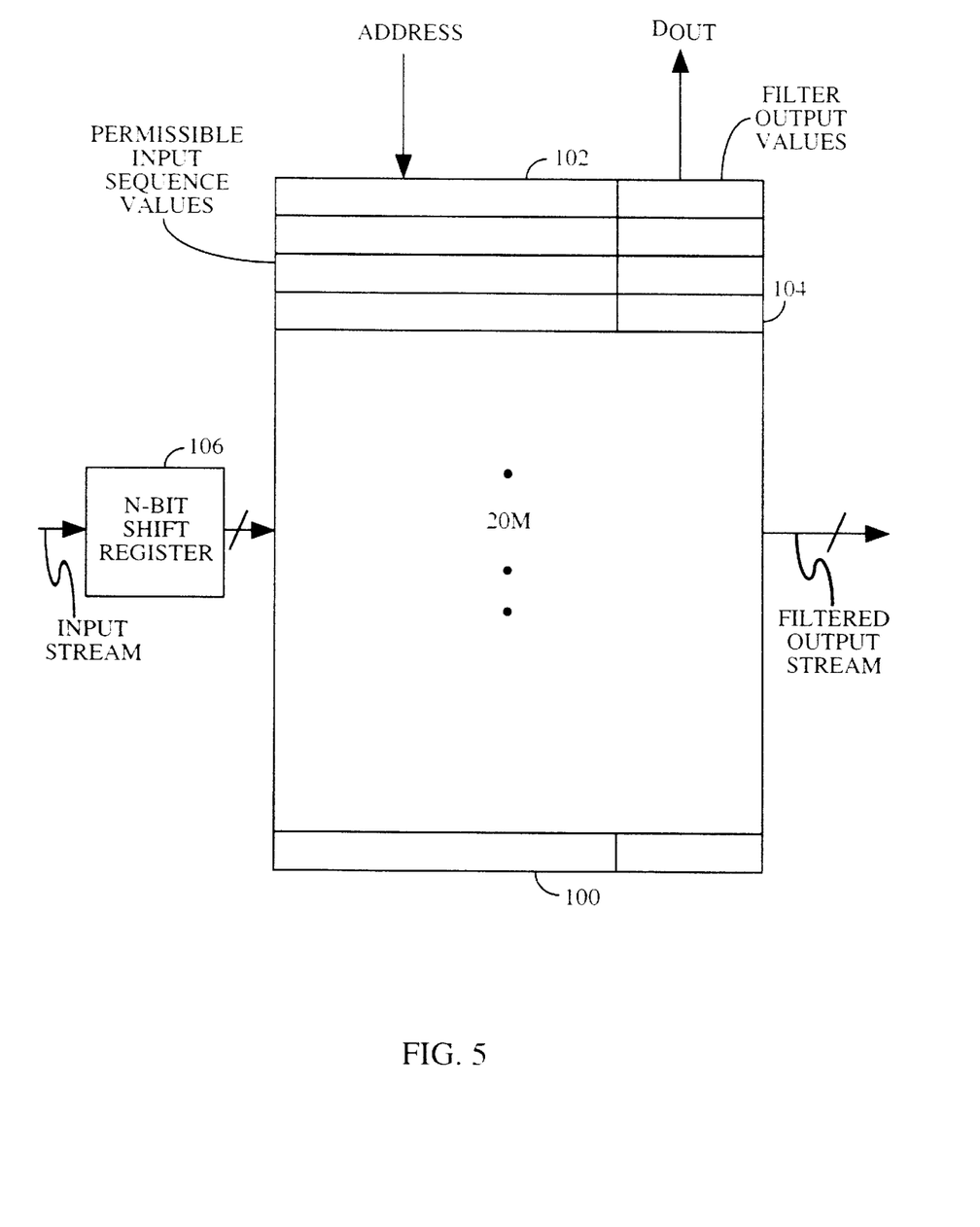
FIG. 5 is a is a block diagram illustrating an exemplary arrangement of the FIR filter of FIG. 1.

FIG. 5 illustrates an FIR filter ROM (read only memory) 100 for use as the filter 20 of the transmission system of FIG. 1 or for use in any other filtering applications consistent with principles of the invention. FIR filter ROM 100 stores a single FIR filter output value for each unique permissible input pattern. As described above, in the exemplary embodiment, the FIR filter processes signals composed of strings of null values (0's) and strings of antipodal values (+1's and −1's) such that the input strings received by the filter are limited to strings having either all antipodal values (+1's and −1's), all null values (0's), leading null values followed by trailing antipodal values or leading antipodal values followed by trailing null values. Hence, the number of permissible combinations of input strings is significantly less than would otherwise be required if all possible combinations of antipodal values and null values were permissible.

Figure 6:
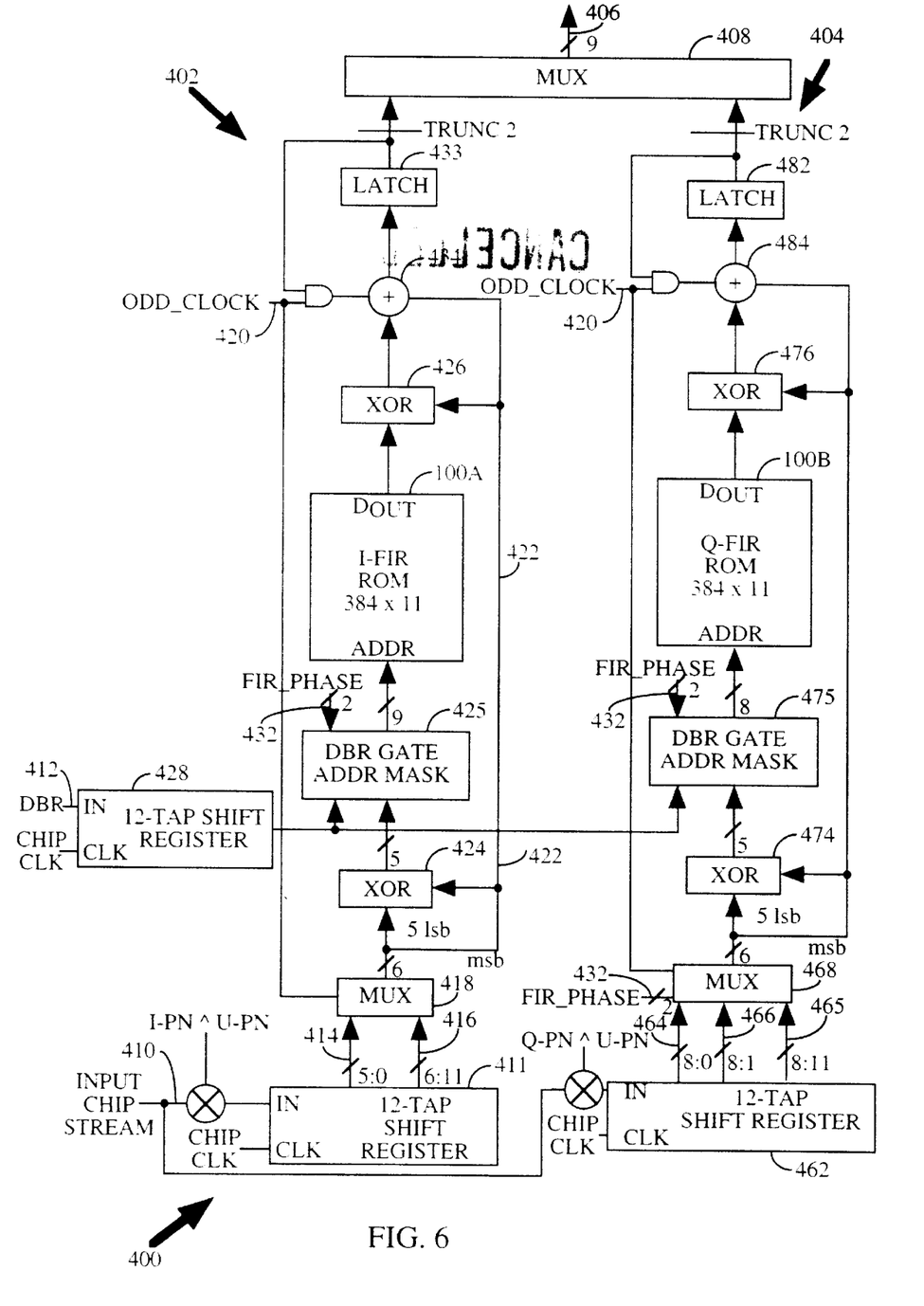
FIG. 6 is a block diagram of a specific exemplary embodiment of the invention for use within a digital cellular telephone employing CDMA transmission techniques.

A fraction of the contents of ROM 100a of FIG. 6 are shown in TABLE III and IV. A "+" in the table corresponds to an antipodal value of +1. A "−" in the table corresponds to a antipodal value of −1. In the Tables, a 0 represents a gated input value of 0. ROM 100a and ROM 100b are illustrated in greater detail in FIG. 5 as ROM 100. ROM 100a stores the information provided in TABLES III and IV. TABLES III and IV provide the output information for the first of the four filter phases. In addition, ROM 100a stores the information necessary for the remaining three phases not provided in TABLES III and IV. The information necessary to complete ROM 100a for the remaining three phases can be computed from the information provided in TABLE II. Likewise, all four phases for ROM 100b can be computed from the information provided in TABLE II.

It should be noted that the FIR filter of the present invention operates using a system clock which runs at eight times the PN chip rate.

Within FIG. 5, the permissible streams of +1's and −1's within the table are identified as input addresses or tag values 102 and the corresponding FIR filter output values are identified by reference numerals 104. To allow the table to distinguish the ungated input streams from the partially or fully gated input streams, separate sub-tables (not shown in FIG. 5) may be provided. An implementation having separate sub-tables is discussed below with reference to FIG. 6.

A shift register 106 is employed to incrementally shift streams of input samples into FIR filter ROM 100 thereby allowing values corresponding to an input stream to be applied, substantially in parallel, to the address tag values to identify the corresponding output filter value. Since the FIR filter table contains all permissible combinations of input streams, the corresponding filtered output value is therefore contained somewhere within the table and can be read out. By merely reading out pre-calculated output filter values, rather than directly calculating the output values as is commonly employed in conventional FIR filters, significant power consumption savings may be achieved. Moreover, the filter values may be readily modified to provide, for example, differing FIR filter coefficients.

The FIR filter outputs one output value per stream position, then increments the stream position by one sample point. Hence, output values regenerated at the same frequency as sample values of the input signal. Thus, if the input signal is sampled with four samples per chip, then the output signal of the FIR filter likewise has four samples per filtered chip. In general, the input signal can be sampled as often as desired to generate any selected number of output samples per chip. In some implementations, the input signal is "sampled" only twice per chip.

To allow the output signal to have multiple samples per chip to thereby provide an analog-like representation of the filtered chips suitable for processing by the DAC (FIG. 1), FIR filter ROM 100 generates four output values for each input stream. This is achieved by subdividing FIR filter ROM 100 into four separate tables corresponding to the four separate phases of the filter. For the purposes of providing a clear overview of the operation of the invention, the FIR filter ROM 100 of FIG. 5 is illustrated merely as a single phase filter providing only one output value per stream of input sample values shifted into FIR filter ROM 100 by shift register 106.

The sequence of chips of sample stream is applied to the various sequences of bits of the address values until a match is achieved, at which time the corresponding filter output value is read out for subsequent processing. Hence, one value is output corresponding to the entire stream of input values. The stream of input values are defined by a sliding window, which is incrementally translated with respect to the input signal to allow a sequence of incrementally different streams to be applied to the table to yield a sequence of corresponding incrementally different filtered output values. Hence, if the window initially selects samples N through N+11 to generate a first filter output value, the window is then repositioned to select samples N+1 through N+12 to generate a second output value, and so on.

In this manner, an entire input signal is incrementally filtered to generate a sequence of output values with one output value per window location. At the beginning or end of the input stream, where the window may extend beyond the input stream, sample values of zero, or some other default value, may be padded onto the actual sample values to provide a complete stream.

The output values are represented digitally, to any desired degree of precision, by employing a multiple bit representation. For example, the output values may be represented using eight bits, eleven bits, etc. The precision to which the output values need to be represented may be constrained, in part, by the characteristics of the input signal and by the number of samples per stream. For the exemplary implementation, an eleven-bit representation of the output filter values is employed.

With reference to FIG. 6, a specific implementation of the FIR filter for use within the system of FIG. 1 will now be described. First, an overview of the operation of the FIR filter will be provided with reference to primary components of the filter. Then a more detailed description of the various internal components of the filter will be provided.

FIR filter of FIG. 6 provides separate in-phase 402 and quadrature phase 404 filtering components. Each component generates four output values for each stream of twelve input chips. As such, both components represent four-phase filters. Two separate FIR filter ROM tables 100a and 100b are illustrated. Each contains four sub-tables (not separately shown) corresponding to each of the four phases. Output values stored within the tables are generated to emulate a forty-eight coefficient filter wherein twelve of the coefficients are employed in connection with each phase. During odd clock cycles, the first six chips of the input stream are applied to FIR filter ROM tables 100a and 100b to generate four output values, with one output value per phase of a four-phased clock period. During an even clock cycle, the remaining six chips are applied to FIR filter ROM tables 100a and 100b, in reverse order, to generate another four output values, again with one output value per phase of the clock signal. Hence, two output values are generated by ROMs 100a and 100b per input stream per every two clock cycles. The two values are summed to yield a single output value of the FIR filter per phase per two clock cycles for outputting on an output line 406.

The in-phase (I) filter ROM 100a and the quadrature phase (Q) filter ROM 100b are implemented slightly differently. The I-filter is a forty-eight tap filter with even symmetry such that the peak of the resulting impulse response falls between h(23) and h(24) for coefficients h(0) to h(47). Moreover, h(23) is equal to h(24). However, the Q-filter is a forty-seven tap filter with odd symmetry such that the peak of the impulse response falls on h(23) for a filter having coefficients h(0) through h(46). Thus, the Q-filter has only forty-seven coefficient values, rather than forty-eight values and cannot be evenly divided by four as with the I-filter. To account for this difference, for the Q-filter, the phase 0 output is the sum of eleven coefficients, whereas the other three phase outputs are each the sum of twelve coefficients.

To handle this exception and still take advantage of the symmetry property, the ROM values of the Q-filter are stored to weight center tap contribution h(23) by half. On phase 0, Q-filter ROM 100b is read using input chips 6:1 as the address for the first access, and chips 6:11 on the second access, rather than using input chips 5:0 on the first access and 6:11 on the second access. In effect, this counts the half-weighted center tap coefficient twice to thereby apply the center coefficient at its full weight. Also, the odd symmetry of Q-filter ROM 100b requires a simple page mapping to track an additional detail: the first half of the phase one coefficients are symmetric with respect to the second half of the phase three coefficients and vice versa.

Coefficients which are compliant with the Telecommunications Industry Association's *TIA/EIA/IS95-A Mobile Station-Base Station Compatibility Standard for Dual-Mode Wideband Spread Spectrum Cellular System* for in-phase and quadrature-phase filter coefficients are provided below in TABLE II.

TABLE II

| k  | I Filter h(k) | Q Filter h(k) |
|----|---------------|---------------|
| 0  | −12           | −11           |
| 1  | −16           | −10           |
| 2  | −17           | −4            |
| 3  | −8            | 10            |
| 4  | 10            | 29            |
| 5  | 30            | 43            |
| 6  | 43            | 45            |
| 7  | 38            | 28            |
| 8  | 17            | 0             |
| 9  | −10           | −26           |
| 10 | −28           | −34           |
| 11 | −24           | −16           |
| 12 | 4             | 19            |
| 13 | 40            | 50            |
| 14 | 60            | 54            |
| 15 | 44            | 20            |
| 16 | −6            | −40           |
| 17 | −67           | −91           |
| 18 | −99           | −94           |
| 19 | −66           | −21           |
| 20 | 44            | 121           |
| 21 | 207           | 291           |
| 22 | 369           | 429           |
| 23 | 469           | 482           |
| 24 | 469           | 429           |
| 25 | 369           | 291           |
| 26 | 207           | 121           |
| 27 | 44            | −21           |
| 28 | −66           | −94           |
| 29 | −99           | −91           |
| 30 | −67           | −40           |
| 31 | −6            | 20            |
| 32 | 44            | 54            |
| 33 | 60            | 50            |
| 34 | 40            | 19            |
| 35 | 4             | −16           |
| 36 | −24           | −34           |
| 37 | −28           | −26           |
| 38 | −10           | 0             |
| 39 | 17            | 28            |
| 40 | 38            | 45            |
| 41 | 43            | 43            |
| 42 | 30            | 29            |
| 43 | 10            | 10            |
| 44 | −8            | −4            |
| 45 | −17           | −10           |
| 46 | −16           | −11           |
| 47 | −12           |               |

Because a FIR filter is a linear system, as shown in equation (2) below:

$$y(-x)=-y(x), \quad (2)$$

where $y(x)$ is the output of the filter given the input x.

Sixty-four entries for in-phase ROM 100a are set forth in Table III. In the exemplary embodiment, only half of the entries in Table III provided below are stored in ROM 100, because the output value for "negative" inputs can be derived by negating the output values from the corresponding "positive" inputs. The sixty-four entries correspond to the un-gated input chip streams i.e. chip streams having antipodal values only. Within the table, the antipodal values of the ungated signal are represented as +'s and −'s.

Table IV provides the entries for the partially gated and completely gated chip streams. Within the table, shifted-in gated values are provided in the left two columns. Shifted-out gated values are provided in the right two columns. Also, within the table, "0's" represent the gated or null values. As can be seen, the gated values are either leading values or trailing values, depending upon whether the gated values are being shifted into or out of the FIR filter. The final entry in the Table, having all "0's", represents the fully gated chip stream. Referring back to Table I, there are a total of 189 possible combinations that can occupy the first six or second six taps of the filter. To provide for the four possible phases of the filter would require 756 possible combinations. However, as described above this number of entries can be halved by taking advantage of the linearity of FIR filter so that only the output values for "positive" input values need to be provided. Thus, the total number of entries in FIR filter ROM tables 100a and 100b are reduced to 378. The "+'s" and "−'s" may be represented digitally within the filter by any appropriate symbol.

TABLE III

| Half Impulse Input Chips | I-ROM Output | Half Impulse Input Chips | I-ROM Output |
|---|---|---|---|
| ++++++ | 57 | −+++++ | 81 |
| +++++− | −31 | −++++− | −7 |
| ++++−+ | 69 | −+++−+ | 93 |
| ++++−− | −19 | −+++−− | 5 |
| +++−++ | 49 | −++−++ | 73 |
| +++−+− | −39 | −++−+− | −15 |
| +++−−+ | 61 | −++−−+ | 85 |
| +++−−− | −27 | −++−−− | −3 |
| ++−+++ | 23 | −+−+++ | 47 |
| ++−++− | −65 | −+−++− | −41 |
| ++−+−+ | 35 | −+−+−+ | 59 |
| ++−+−− | −53 | −+−+−− | −29 |
| ++−−++ | 15 | −+−−++ | 39 |
| ++−−+− | −73 | −+−−+− | −49 |
| ++−−−+ | 27 | −+−−−+ | 51 |
| ++−−−− | −61 | −+−−−− | −37 |
| +−++++ | 37 | −−++++ | 61 |
| +−+++− | −51 | −−+++− | −27 |
| +−++−+ | 49 | −−++−+ | 73 |
| +−++−− | −39 | −−++−− | −15 |
| +−+−++ | 29 | −−+−++ | 53 |
| +−+−+− | −59 | −−+−+− | −35 |
| +−+−−+ | 41 | −−+−−+ | 65 |
| +−+−−− | −47 | −−+−−− | −23 |
| +−−+++ | 3 | −−−+++ | 27 |
| +−−++− | −85 | −−−++− | −61 |
| +−−+−+ | 15 | −−−+−+ | 39 |
| +−−+−− | −73 | −−−+−− | −49 |
| +−−−++ | −5 | −−−−++ | 19 |
| +−−−+− | −93 | −−−−+− | −69 |
| +−−−−+ | 7 | −−−−−+ | 31 |
| +−−−−− | −81 | −−−−−− | −57 |

TABLE IV

| Gating Shift In | | Gating Shift Out | | | | | |
|---|---|---|---|---|---|---|---|
| Half Impulse Input Chips | I-ROM Output | Half Impulse Input Chips | I-ROM Output | Half Impulse Input Chips | I-ROM Output | Half Impulse Input Chips | I-ROM Output |
| +++++0 | 13 | −++++0 | 37 | 0+++++ | 69 | 0++++− | −19 |
| ++++−0 | 25 | −+++−0 | 49 | 0++++−+ | 81 | 0+++−− | −7 |
| +++−+0 | 5 | −++−+0 | 29 | 0+++−+ | 61 | 0+++−+− | −27 |
| +++−−0 | 17 | −++−−0 | 41 | 0+++−+ | 73 | 0++−−− | −15 |
| ++−++0 | −21 | −+−++0 | 3 | 0+−+++ | 35 | 0+−++− | −53 |
| ++−+−0 | −9 | −+−+−0 | 15 | 0+−+−+ | 47 | 0+−+−− | −41 |
| ++−−+0 | −29 | −+−−+0 | −5 | 0+−−++ | 27 | 0+−−+− | −61 |
| ++−−−0 | −17 | −+−−−0 | 7 | 0+−−−+ | 39 | 0+−−−− | −49 |
| +−+++0 | −7 | −−+++0 | 17 | 0−++++ | 49 | 0−+++− | −39 |
| +−++−0 | 5 | −−++−0 | 29 | 0−++−+ | 61 | 0−++−− | −27 |
| +−+−+0 | −15 | −−+−+0 | 9 | 0−+−++ | 41 | 0−+−+− | −47 |
| +−+−−0 | −3 | −−+−−0 | 21 | 0−+−−+ | 53 | 0−+−−− | −35 |
| +−−++0 | −41 | −−−++0 | −17 | 0−−+++ | 15 | 0−−++− | −73 |
| +−−+−0 | −29 | −−−+−0 | −5 | 0−−+−+ | 27 | 0−−+−− | −61 |
| +−−−+0 | −49 | −−−−+0 | −25 | 0−−−++ | 7 | 0−−−+− | −81 |
| +−−−−0 | −37 | −−−−−0 | −13 | 0−−−−+ | 19 | −−−−−− | −69 |

TABLE IV-continued

| Gating Shift In | | Gating Shift Out | | | | | |
|---|---|---|---|---|---|---|---|
| Half Impulse Input Chips | I-ROM Output | Half Impulse Input Chips | I-ROM Output | Half Impulse Input Chips | I-ROM Output | Half Impulse Input Chips | I-ROM Output |
| ++++00 | 19 | −+++00 | 43 | 00++++ | 59 | 00+++− | −29 |
| +++−00 | 11 | −++−00 | 35 | 00++−+ | 71 | 00++−− | −17 |
| ++−+00 | −15 | −+−+00 | 9 | 00+−++ | 51 | 00+−+− | −37 |
| ++−−00 | −23 | −+−−00 | 1 | 00+−−+ | 63 | 00+−−− | −25 |
| +−++00 | −1 | −−++00 | 23 | 00−+++ | 25 | 00−++− | −63 |
| +−+−00 | −9 | −−+−00 | 15 | 00−+−+ | 37 | 00−+−− | −51 |
| +−−+00 | −35 | −−−+00 | −11 | 00−−++ | 17 | 00−−+− | −71 |
| +−−−00 | −43 | −−−−00 | −19 | 00−−−+ | 29 | 00−−−− | −59 |
| +++000 | 15 | −++000 | 39 | 000+++ | 42 | 000++− | −46 |
| ++−000 | −19 | −+−000 | 5 | 000+−+ | 54 | 000+−− | −34 |
| +−+000 | −5 | −−+000 | 19 | 000−++ | 34 | 000−+− | −54 |
| +−−000 | −39 | −−−000 | −15 | 000−−+ | 46 | 000−−− | −42 |
| ++0000 | −2 | −+0000 | 22 | 0000++ | 38 | 0000+− | −50 |
| +−0000 | −22 | −−0000 | 2 | 0000−+ | 50 | 0000−− | −38 |
| +00000 | −12 | −00000 | 12 | 00000+ | 44 | 00000− | −44 |
| 000000 | 0 | | | | | | |

The output values represented in Table III and IV are derived from the coefficient values of Table II. Consider, for example, an input chip stream having the first six chips represented by +1, −1, +1, −1, +1, −1, or "+−+−+−". For phase 0, this corresponds to h(0)−h(4)+h(8)−h(12)+h(16)−h(20) or (−12)−(+10)+(17)−(+4)+(−6)−(+44) or −59 which is the value within Table III corresponding to the "+−+−+−" input address combination. Note that the output for the complement input "−+−+−+" is +59. Hence, only one value need be stored for each complementary pair of input values. The most significant bit of each stream of six input values is used to determine whether the input stream needs to be inverted. If the MSB is −1, the input address is inverted, then the output value is inverted. If the MSB is +1, then no inversion is required. Although not separately illustrated herein, separate tables are provided for the quadrature phase. Values for use in the quadrature phase tables may derived from the quadrature phase values of Table II.

The manner in which the foregoing features are implemented will now be described with reference to the diagram of FIG. 6. FIG. 6 illustrates a FIR filter unit 400 having a in-phase portion 402 and a quadrature phase portion 404. Outputs of the two portions are combined onto a single output signal path 406 by a multiplexer 408 for subsequent conversion to analog signals for transmission. Power control groups composed entirely of +1's and −1's are received along an input line 410. A DBR gating value of G or NG is input along a DBR line 412. One DBR gating value is received for each chip of the input power control group. If the gating value is G, then the power control group is gated and the corresponding chip may be regarded as being a 0 value. If the DBR gating value is NG, then the chip value is ungated and retains its input value of +1 or −1.

Now, the in-phase components will be described. The stream of input chips received along line 410 is first combined with I-PN and U-PN signals to perform spreading, then the resulting spread signals are shifted in using a shift register 428.

The shift register 428 outputs twelve bits in parallel along separate lines 414 and 416. Line 414 contains bits 5:0, whereas line 416 carries bits 6:11. Hence, the first six bits are reverse ordered. This is employed to help exploit the symmetry of the filter, summarized above. A multiplexer 418 selects either the lower six bits or the upper six bits depending upon the value of an odd clock signal received along line 420. If the clock is odd, then the lower bits are selected, if the clock is even, then the upper bits are selected. The MSB of the selected bits is separated onto a line 422 for use in controlling a pair of XOR gates 424 and 426.

The lower five LSB's are routed directly into XOR gate 424. If the MSB is 0, then the other five bits are inverted to yield the compliment thereof to exploit the linearity feature summarize above. The resulting five bits are routed into a DBR gate address mask unit 425 which also receives the G or NG bits from a twelve-tap DBR shift register 428 connected to input line 412. The DBR gate address mask matches the G and NG signals from shift register 428 with the corresponding bits of the input chip signal received from gate 424. The DBR gate address mask also receives a filter phase signal along an input line 432 for selecting the appropriate phase.

Although not separately shown in FIG. 6, I-FIR ROM 100a is composed of four separate table portions corresponding to the four separate phases. The DBR gate address mask then maps the +1's and −1's of the chip signal for each phase, with the corresponding G and NG values of the DBR signal to yield an address suitable for selecting the correct corresponding filter value from an I-FIR ROM 100a. The actual format of the address depends upon how the data is stored within the ROM. Suitable addresses are described above with reference to Table IV.

Thus, the address generated by the DBR gate address mask uniquely identifies one entry within ROM 100. ROM 100 contains 378 entries. To uniquely address each entry, a total of nine address bits are employed. The nine bit address is generated from the six ternary values input into the filter.

The nine bit address is applied to the ROM table 100a to generate a single unique output value represented digitally using eleven bits. The eleven bits of the output value are fed into the second XOR gate 426 for inversion if the original MSB was 0. The resulting value is stored at latch 428 for subsequent combination with the output value corresponding to the upper six bits of the input chip stream. During the next subsequent even clock cycle, the upper six bits are processed, in much the same manner as the lower six bits, to yield a second output value. The first output value stored in latch 433 is combined with a second output value by an adder gate 434 to yield a digital signal for outputting. The two least significant bits of the digital signal are truncated, then the signal is fed into multiplexer 408 for subsequent output onto line 406 along with output values from the quadrature phase portion of the filter.

Thus, to briefly summarize operation of the in-phase portion, during each odd clock within a chip four values are output from I-ROM 100a corresponding to the four filter phases. The four output values are each stored within latch 433. During the next even clock four additional values are output from I-ROM 100a corresponding to the four phases. The first sets of values generated during the odd clock are based upon the lower six bits of the input chip stream. The second four values generated during the even clock are based upon the upper six bits of the input chip stream. The pairs of first and second values are summed to yield a total of four output values per pair of clock signals. For other implementations, it may be desirable to generate all four output values within each clock period. This may achieved, by example, by doubling the size of I-ROM 100a thereby eliminating the need to separately calculate lower and upper output values.

The operation of the quadrature phase portion is similar to that of the in-phase portion and only pertinent differences will be described. The quadrature phase portion includes a shift register 462 which outputs bits in parallel along three separate lines 464, 465 and 466 to a multiplexer 468. Hence, unlike multiplexer 418 of the in-phase portion which receives only two inputs corresponding to the 5:0 and 6:11 input bits, multiplexer 468 receives three different inputs corresponding to the 5:0, 6:1 and 6:11 bits. This is provided to accommodate for the slight asymmetry in the quadrature phase filter coefficients summarized above. Multiplexer 468 selects signals from one of the three input lines based both upon the odd clock signal 420 and the filter phase signal 432. For the first filter phase, during the odd clock, bits 6:1 are selected and bits 6:11 are selected during the even clock. For the other three phases, selection is between the 5:0 and 6:11 bits as described with reference to the in-phase portion.

The six bits selected by the multiplexer are routed to an XOR gate 474 and the MSB are routed along a line 472. The XOR gate inverts the bits, depending upon the MSB, and routes the resulting bits into a DBR gate address mask 475 which operates in the same manner as that of mask 425 of the in-phase portion. A nine bit address is applied to a Q-FIR ROM 100b, outputs of which are routed through a second XOR gate 476 into a latch 482. The values latched during the odd clock are combined with values output from the ROM 100b during the even clock to yield final output signals for transmission onto output line 406 via multiplexer 408.

In an alternative arrangement, instead of storing both DBR-gated and ungated output values within ROM tables 100a and 100b, only the ungated output values are stored. Output values for the DBR-gated input values are computed from the output values corresponding to the ungated input values by summing two successive accesses to ROM tables 100a and 100b. The first access uses the ungated or "unmasked" filter input as an address, the second access uses the input with DBR-gated chips inverted as compared to those of the first access. Summing the resulting two output values together therefore has the net effect of canceling the DBR-gated chip inputs. The summed output value is shifted by a bit position to reduce the value by half to cancel a times-two scaling inherently occurring as a result of the summation of the two output values.

In this alternative implementation, because two reads from the ROM 100 are required for each half-filter output, the ROM word width needs to be two results wide; with twice as many bits accessed per output required. Two phases are summed in parallel to maintain the same FIR filter output rate. As such, ROM 100 itself is somewhat more complex than the ROM of the preceding embodiment. However, ROM 100 of the alternative embodiment stores only 128 unmasked values, arranged as 64 words twice as wide as the words of FIG. 6 making it approximately one-third the size of ROM 100 which includes DBR gated values.

What has been described is an implementation of an FIR filter configured as a table. Specific implementations have been described herein with reference to a digital cellular telephone employing CDMA transmission techniques in accordance with IS-95-A protocols wherein the number of entries required in the FIR table are limited by exploiting unique characteristics of the signals to be filtered.

It should be noted that additional power savings can be attained by not accessing ROM 100 when the input sequence is all zeroes. With variable rate data, this is the case the majority of the time.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A finite impulse response (FIR) filter apparatus comprising:

means for receiving an input signal stream having groups of consecutive non-null signals bracketed by groups of consecutive null signals;

means for storing FIR filter output values, wherein the means for storing stores only FIR filter output values for each of a predetermined set of unique permissible input stream patterns, with the set of permissible input stream patterns including only patterns containing either leading non-null signals followed by trailing null signals, leading null signals followed by trailing non-null signals, all non-null signals or all null signals; and means for successively applying sequences of consecutive signals from the input signal stream to the means for storing to read out a sequence of output values corresponding to a filtered version of at least a portion of the input stream.

2. The apparatus of claim 1 wherein the non-null signals are antipodal signals.

3. The apparatus of claim 1 wherein the means for storing comprises a ROM.

4. The apparatus of claim 1 wherein the means for storing stores filter values corresponding to a symmetric FIR filter.

5. The apparatus of claim 1 wherein the permissible input stream patterns each include N signals and the groups of consecutive non-null signals each include at least N signals; and wherein sequences of N consecutive signals are applied to the means for storing, with N greater than 2.

6. A finite impulse response (FIR) filter apparatus for use in filtering an input signal stream, said filter apparatus comprising:

a receiver receiving an input signal stream having groups of consecutive non-null signals bracketed by groups of consecutive null signals;

a memory unit containing FIR filter output values, wherein the memory unit stores only FIR filter output values for each of a predetermined set of unique permissible input stream patterns, with the set of permissible input stream patterns including only patterns containing either leading non-null signals followed by trailing null signals, leading null signals followed by trailing non-null signals, all non-null signals or all null signals; and an input control unit for successively applying sequences of consecutive signals from the input signal stream to memory unit to read out a sequence of output values corresponding to a filtered version of at least a portion of the input stream.

7. The apparatus of claim 6 wherein the non-null signals are antipodal signals.

8. The apparatus of claim 6 wherein the memory unit comprises a ROM.

9. The apparatus of claim 6 wherein the memory unit stores filter values corresponding to a symmetric FIR filter.

10. The apparatus of claim 6 wherein the permissible input stream patterns each include N signals and the groups of consecutive non-null signals each include at least N signals; and wherein sequences of N consecutive signals are applied to the memory unit, with N greater than 2.

11. A method for filtering an input signal stream, said method comprising the steps of:

receiving an input signal stream to be filtered, said input signals stream having groups of consecutive non-null signals bracketed by groups of consecutive null signals; and successively applying sequences of consecutive signals from the input signal stream to a memory unit containing FIR filter output values to output a sequence of output values corresponding to a filtered version of at least a portion of the input stream, wherein the memory unit stores only FIR filter output values for each of a predetermined set of unique permissible input stream patterns, with the set of permissible input stream patterns including only patterns containing either leading non-null signals followed by trailing null signals, leading null signals followed by trailing non-null signals, all non-null signals or all null signals.

12. The method claim 11 wherein the permissible input stream patterns each include N signals and the groups of consecutive non-null signals each include at least N signals; and wherein sequences of N consecutive signals are applied to the memory unit, with N greater than 2.

13. An apparatus for converting a digital signal into an analog signal, said apparatus comprising:

means for receiving an input digital signal stream having groups of consecutive non-null signals bracketed by groups of consecutive null signals;

means for storing digital FIR filter output values, wherein the means for storing stores only FIR filter output values for each of a predetermined set of unique permissible input stream patterns, with the set of permissible input stream patterns including only patterns containing either leading non-null signals followed by trailing null signals, leading null signals followed by trailing non-null signals, all non-null signals or all null signals;

means for successively applying sequences of consecutive signals from the input digital signal stream to the means for storing to read out a sequence of digital FIR filter values corresponding to the input stream patterns; and digital to analog conversion means for converting the sequence of digital FIR filter values into an analog signal.

14. The apparatus of claim 13 further comprising means for transmitting the analog signal.

15. The apparatus of claim 14 wherein the means for transmitting comprises a transmit unit of a cellular telephone.

16. The apparatus of claim 13 wherein the input digital signal stream is formatted in accordance with code division multiple access (CDMA) formats.

17. The apparatus of claim 13 wherein the means for storing comprises a read-only memory (ROM).

18. The apparatus of claim 14 wherein the means for transmitting comprises:

means for transmitting an in-phase analog signal; and means for transmitting an quadrature phase analog signal.

19. The apparatus of claim 18 wherein the means for receiving the input digital signal stream comprises:

means for receiving streams corresponding to an in-phase signal; and means for receiving streams corresponding to a quadrature phase signal.

20. The apparatus of claim 19 wherein the means for storing comprises:

an in-phase memory unit for storing sets of digital values corresponding to permissible in-phase streams; and a quadrature phase memory unit for storing sets of digital values corresponding to permissible quadrature phase streams.

21. The apparatus of claim 13 further comprising:

means for duplicating portions of the input digital signal stream; and means for selectively eliminating some of the duplicative portions within a predetermined time period.

22. The apparatus of claim 21 wherein each duplicative portion of the input digital signal stream comprises a power control group.

23. The apparatus of claim 21 wherein the means for selectively eliminating some of the duplicative portions of the input digital signal stream comprises a data-burst-randomizer (DBR).

24. The apparatus of claim 13 wherein the non-null signals are antipodal signals.

25. The apparatus of claim 13 wherein the digital FIR filter output values stored within the means for storing are representative of a linear, symmetric finite impulse representation of the permissible input stream patterns.

26. The apparatus of claim 13 implemented within an integrated circuit chip.

27. The apparatus of claim 13 wherein the means for storing stores separate values for four separate filter phases.

28. The apparatus of claim 27 wherein the means for storing stores partial sums representative of a 12-tap FIR filter employing forty-eight coefficients and wherein each value for each phase represents the sum of the product of six binary input values and six of the coefficients.

29. A method for converting a digital signal into an analog signal, said method comprising the steps of:

receiving an input digital signal stream having groups of consecutive non-null signals bracketed by groups of consecutive null signals;

successively applying sequences of consecutive signals from the input digital signal stream to a memory unit containing digital FIR filter output values to read out a sequence of digital FIR filter values corresponding to the input stream patterns, wherein the memory unit contains only FIR filter output values for each of a predetermined set of unique permissible input stream patterns, with the set of permissible input stream patterns including only patterns containing either leading non-null signals followed by trailing null signals, leading null signals followed by trailing non-null signals, all non-null signals or all null signals; and converting the sequence of digital values into an analog signal.

30. The method of claim 29 further comprising the step of transmitting the analog signal.

31. The method of claim 29 wherein the received digital signals are formatted in accordance with code division multiple access (CDMA) formats.

32. The method of claim 29 further comprising the steps of:

duplicating portions of the input digital signal stream; and selectively eliminating some of the duplicative portions within a predetermined time period before successively applying the sequences of consecutive signals to the memory unit.

33. The method of claim 32 wherein each duplicative portion of the input digital signal stream comprises a power control group.

34. The method of claim 29 wherein the non-null signals are antipodal signals.

35. An apparatus for converting a digital signal into an analog signal, said apparatus comprising:

a receiver unit connected to an input line providing an input digital signal stream having groups of consecutive non-null signals bracketed by groups of consecutive null signals;

a memory unit storing a table containing digital FIR filter output values, wherein the memory unit stores only FIR filter output values for each of a predetermined set of unique permissible input stream patterns, with the set of permissible input stream patterns including only patterns containing either leading non-null signals followed by trailing null signals, leading null signals followed by trailing non-null signals, all non-null signals or all null signals;

a shift register, connected between the receiver unit and the memory unit, said shift register successively applying sequences of consecutive signals from the input digital signal stream to the memory unit to cause the memory unit to read out a sequence of digital FIR filter values corresponding to the input stream patterns; and a digital to analog converter connected to the memory unit, said digital to analog converter operating to convert the sequence of digital FIR filter values into an analog signal.

36. The apparatus of claim 35 wherein the non-null signals are antipodal signals.

37. The apparatus of claim 35 wherein the memory unit stores separate values for four separate filter phases.

38. The apparatus of claim 37 wherein the memory unit stores partial sums representative of a 12-tap FIR filter employing forty-eight coefficients and wherein each value for each phase represents the sum of the product of six binary input values and six of the coefficients.

39. The apparatus of claim 35 wherein the permissible input stream patterns each include N signals and the groups of consecutive non-null signals each include at least N signals; and wherein sequences of N consecutive signals are applied to the means for storing, with N greater than 2.

* * * * *